United States Patent [19]

Crawford

[11] Patent Number: 4,867,207

[45] Date of Patent: Sep. 19, 1989

[54] UNIVERSAL HARNESS BOARD

[75] Inventor: Thomas Crawford, Salsbury, Md.

[73] Assignee: Grumman Aerospace Corporation, Bethpage, N.Y.

[21] Appl. No.: 222,067

[22] Filed: Jul. 8, 1988

[51] Int. Cl.$^4$ ............................................. B21F 27/00
[52] U.S. Cl. ................................... 140/92.1; 29/755; 403/DIG. 6
[58] Field of Search .............. 140/92.1, 93 R; 29/739, 29/755; 403/325, 328, DIG. 6

[56] References Cited

U.S. PATENT DOCUMENTS 3,507,528 4/1970 Desmarchais ....................... 403/325

FOREIGN PATENT DOCUMENTS 903992 2/1982 U.S.S.R. ................................. 29/755
928688 5/1982 U.S.S.R. ................................. 29/755

*Primary Examiner*—Lowell A. Larson
*Attorney, Agent, or Firm*—Richard G. Geib; Daniel J. Tick; Bernard S. Hoffman

[57] ABSTRACT

The invention features a universal harness board for wiring harnesses of different configurations. The board is of box-like construction. A plurality of pins are disposed inside the board. The pins are spring biased to extend above the work surface of the board. Each pin has a locking mechanism to hold it in a retracted position until a plunger is depressed to release it to its extended position. The release of certain ones of the pins will provide the desired wiring pattern.

16 Claims, 2 Drawing Sheets

UNIVERSAL HARNESS BOARD

FIELD OF THE INVENTION

The invention relates to wiring harness boards, and more particularly to a universal-type wiring harness board that can accommodate wiring patterns of different configuration.

BACKGROUND OF THE INVENTION

In recent times, wiring harnesses have become very complex, necessitating the need to automate the wiring process.

It has been suggested that one of the ways to streamline the fabrication of harnesses, is to construct a universal harness board which is capable of changing its pin arrangement to accommodate different wiring patterns.

Such a universal wiring harness is illustrated in U.S. Pat. No. 4,483,373.

This type of universal harness board can be wired by robot controls, and is useful in the fabrication of Despite the many advantages of this harness board design, certain disadvantages remain which make this board impractical for aircraft wiring.

In the first instance, the board requires mounting on a frame for rotation. The rotation of the harness board is necessary, because the pins can only be extended in the reverse board position.

In the aircraft industry where harnesses can grow to eighteen feet in length, reversal of an eighteen foot harness board would be extremely cumbersome, and would require a massive cradle or frame to support and turn the board. Verification of pin extension would also be difficult.

The pins of the harness board of the aforementioned patent are only lockable en masse.

If the locking mechanism should jam or become disabled, the whole wiring board must be dismantled.

With the system of this invention each pin has its own individual locking mechanism. Should one of the pins become jammed or disabled, it is easily replaced from the front of the board, and the board can be quickly brought back on the production line.

Another difficulty with this particular locking mechanism shown in the patented device is the complexity of constructing the inner-workings of the box frame structure.

The present invention has designed a harness board which eliminates the aforementioned disadvantages and drawbacks of the previous system.

The harness board of the present invention is much easier to fabricate, owing to the fact that the box-like frame is essentially of one-piece construction, and hasn't any internal working parts.

BRIEF SUMMARY OF THE INVENTION

The invention features a universal-type harness board having the capacity for fabricating harnesses with different configurations upon the board by changing a pin pattern to accommodate each different configuration.

The universal-type harness board of this invention has a board-like structure with a work surface upon which an array of pins is disposed. The pins are positioned about the work surface in a grid pattern. The pins are spring-biased in an extended position to project above the board.

Each pin has its own individual ball-detent locking means for locking it in a retracted position, so that it will not extend above the work surface.

The wiring harness is constructed about the extended pins. Each pin is releasable from the locked position by a movable sleeve which is depressed manually or by a programmable robot arm. Each depressed sleeve displaces places the ball detent from a groove in the pin in order to release the pin from its retracted position.

It is an object of the invention to provide an improved universal-type harness board.

It is another object of this invention to provide a universal-type harness board that is easy to construct, operate and maintain.

These and other objects of the invention will become more apparent and will be better understood with reference to the subsequent detailed description considered in conjunction with the accompanying drawings.

BRIEF DESCRIPTION OF THE DRAWINGS

In order that the invention may be readily carried into effect, it will now be described with reference to the accompanying drawings, wherein.

DETAILED DESCRIPTION OF THE INVENTION

Generally speaking, the invention pertains to a universal-type harness board for constructing wiring harnesses with different wiring patterns or configurations.

The harness board comprises an essentially solid or hollow box frame structure. Wiring pins are individually extended from, and retracted into, the box frame to provide a work surface whose wiring pattern is easily changed for each individual requirement.

Figure 1:
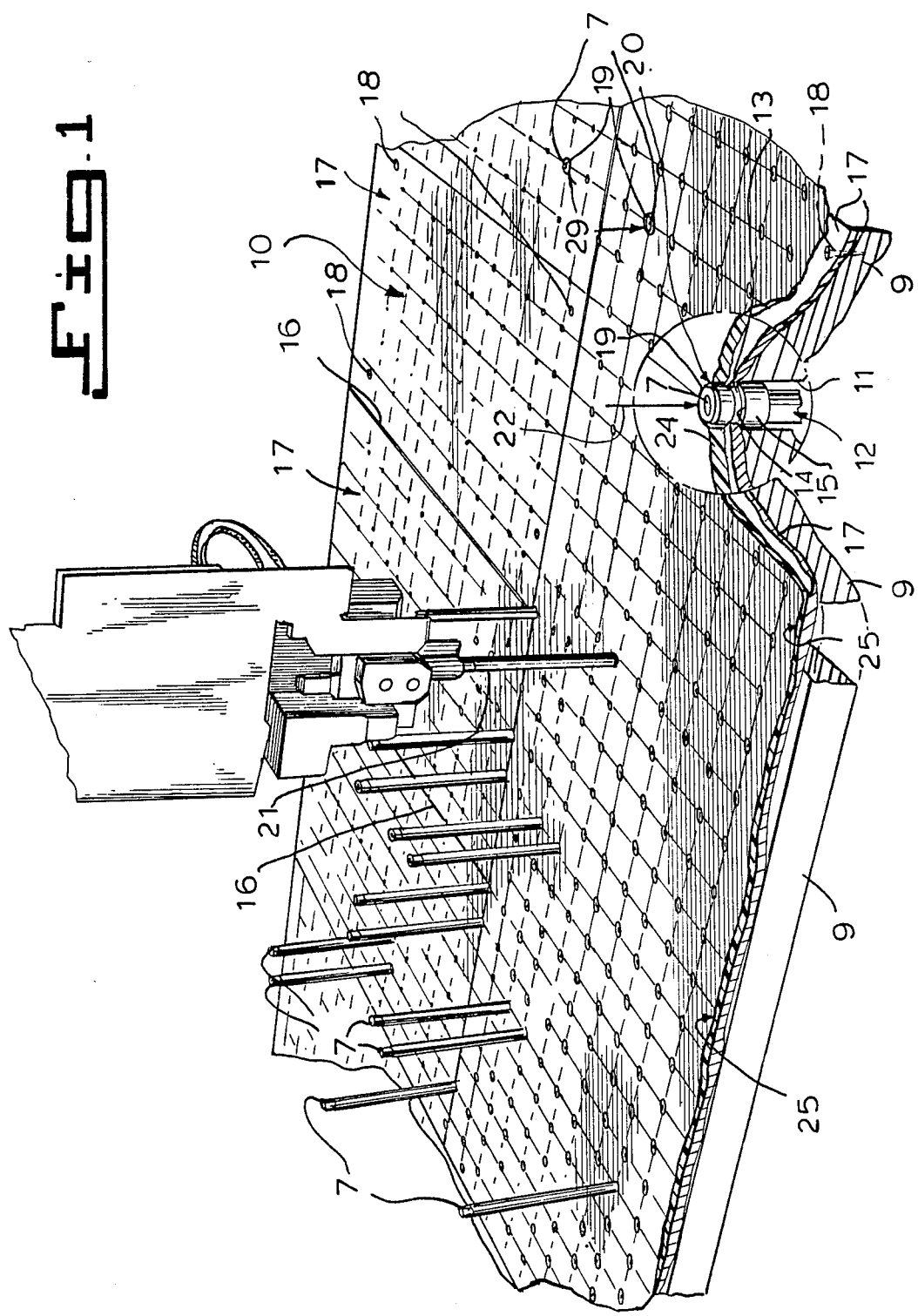
FIG. 1 is a partial perspective, in situ view of the harness board of this invention, having a sectional view of a typical pin mechanism disposed therein.

Now referring to FIG. 1, the universal-type harness board of this invention is generally shown by arrow 10. The harness board 10 comprises an essentially solid box-frame 9 having an grid patterned array of wells 11 disposed therein. Each well 11 is constructed to house a pin mechanism 12, which is shown in more detail in FIG. 2. The box-frame can also be made hollow, with internal support plates (not shown) for the internal pin mechanisms.

For the sake of clarity, like elements will have the same designation throughout the drawings.

Each pin mechanism 12 is secured in its well 11 by a cover plate 17, which extends over the lip 14 of the collar 15 of the pin mechanism. The cover plate 17 can be constructed as individual square plates which abut each other at edges 16, and are fastened to the box frame 9 at their corners by screws 18. A jammed or defective pin mechanism 12 can be removed from its well 11 by removing plate 17 from frame 9. The individual plates 17 have a grid pattern of holes 20 (typically shown on one inch centerlines herein), which are disposed adjacent each well 11, and allow a robot arm 21 to position itself over the pin mechanism 12 disposed therein. The robot arm 21, as will be discussed in more detail hereinafter, can be programmed to trigger each pin mechanism 12 to release its pin 7.

When the pin mechanism 12 is triggered to release its pin 7, the pin 7 will extend about 4 inches above the work surface 25 of the harness board 10, as shown.

In its retracted position, each pin 7 will lie flush or slightly below work surface 25.

The individual plates 17, while retaining the pin mechanism 12 inside well 11 by extending over lip 14, as aforementioned, provide hole 20 with enough clearance to allow the neck 13 of plunger 19 to move therein.

When the plunger 19 is depressed (arrow 22) either manually or by robot arm 21, the pin 7 which is normally locked in the retracted position by a ball detent 30 (FIG. 2), will be urged by the compressed coil spring 31 of the pin mechanism 12 to move to the extended position "A".

The pin 7 can thereafter be retracted by depressing the pin 7 (arrow 40) back into plunger 19.

Figure 2:
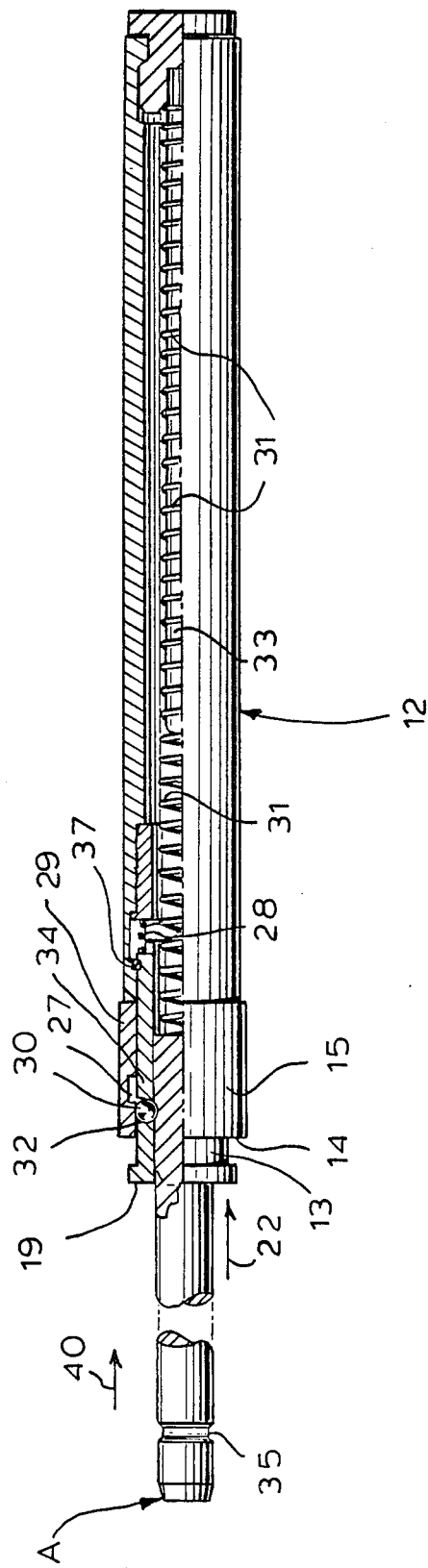
FIG. 2 is a sectional view of the typical pin mechanism of the harness board shown in FIG. 1.

Referring to FIG. 2, the pin mechanism 12 is shown with the pin 7 in its extended position A. When the pin 7 is depressed (arrow 40) against spring 31 back into plunger 19, the ball detent 30 snaps into the groove 35 in the head of pin 7, thus locking the pin in its retracted position.

When plunger 19 is depressed (arrow 22), the ball detent 30 which rides in a groove 32 of the plunger sleeve 34, is caused to pop out of groove 35 of pin 7 as it moves adjacent to inner cavity 27 in the outer sleeve housing 29, thus releasing pin 7 from its locked, retracted position.

The compressed coil spring 31 then pushes the pin 7 to its extended position A.

The spring 31 is guided within housing 29 by means of guide member 33.

The plunger 19 is also spring-loaded by means of compressed coiled spring 28, so that it will snap back to its original position after it's depressed. A retaining ring 37 limits the upward travel of the plunger 19. The plunger 19 can only be depressed as far as the lip 14 of collar 15.

Referring once more to FIG. 1, a transparent plastic sheet 24 of mylar or an other type of transparent plastic, can be overlayed upon the work surface 25 to indicate which of the pins 7 are to be extended. The sheet 24 has holes 29 coincident with holes 20 in plates 17 for only those pins 7 which are to be extended.

The harness board of this invention can be manually or automatically operated.

Having thus described the invention, what is desired to be protected by Letters Patent is presented by the subsequently appended claims.

What is claimed is:

1. A universal-type harness board having the capacity for fabricating harnesses with different configurations upon said board by changing a pin pattern to accommodate each different configuration, said harness board comprising
   a board-like structure having a work surface upon which an array of pins is disposed;
   means defining an array of pins positioned about said work surface, each pin of said array being biased in an extended position whereby each pin will project above said work surface, each pin being disposed in a movable sleeve;
   individual pin locking means for locking each responsive pin in said array in a retracted position, such that each retracted pin will not substantially extend above said work surface; and
   releasing means for individually releasing any of said pin locking means, whereby any pin in said array can be extended above said work surface by depressing the sleeve of said pin to provide a pattern for accommodating each different harness configuration.

2. The universal-type harness board of claim 1, wherein said array means further defines a grid-pattern.

3. The universal-type harness board of claim 1, further comprising an over-lay for covering said work surface.

4. The universal-type harness board of claim 3, wherein said over-lay comprises a sheet having holes in select positions for allowing certain ones of said pins to extend above said work surface to form a desired pattern.

5. The universal-type harness board of claim 1, wherein said pin locking means comprises a ball detent, each pin having means defining a groove for receiving said ball detent, said ball detent holding said pin in a retracted position, when said detent is disposed within said groove.

6. The universal-type harness board of claim 1, wherein said board-like structure has a box-like configuration.

7. The universal-type harness board of claim 6, wherein said box-like configuration is essentially solid.

8. The universal-type harness board of claim 7, further comprising means defining a plurality of wells disposed in said box-like configuration for supporting said pins.

9. The universal-type harness board of claim 6, wherein said box-like configuration is essentially hollow.

10. A universal-type harness board having the capacity for fabricating harnesses with different configurations upon said board by changing pin pattern to accommodate each different configuration, comprising
    a board-like structure having a work surface upon while an array of pins is disposed;
    means defining an array of pins positioned about said work surface, each pin of said array being biased in an extended position whereby each pin will project above said work surface;
    individual pin locking means for locking each respective pin in said array in a retracted position, such that each retracted pin will not substantially extend above said work surface, said pin locking means comprising a ball detent, each pin having means defining a groove for receiving said ball detent, said ball detent holding said pin in a retracted position when said detent is disposed within said groove; and
    releasing means for individually releasing any of said pin locking means, whereby any pin in said array can be extended above said work surface to provide a pattern for accommodating each different harness configuration, said releasing means comprising a movable sleeve, each pin being disposed within said movable sleeve, and each sleeve being depressable for displacing said ball detent from said groove, whereby each pin becomes releaseable from its retracted position.

11. The universal-type harness board of claim 10, wherein each pin is biased towards the extended position by a coil spring.

12. The universal-type harness board of claim 10, wherein each sleeve is depressable manually or by a programmable robot arm.

13. The universal-type harness board of claim 10, wherein each sleeve and pin are disposed within a cylindrical housing.

14. A universal-type harness board having the capacity for fabricating harnesses with different configuration upon said board by changing a pin pattern to accommodate each different configuration, said harness board comprising a board-like structure having a work surface upon which an array of pins is disposed;

array means defining an array of pins positioned about said work surface in a grid pattern, each pin of said array being biased in an extended position whereby each pin will project above said work surface;

individual pin locking means for locking each respective pin in said array in a retracted position, such that each retracted pin will not substantially extend above said work surface;

releasing means for individually releasing any of said pin locking means, whereby any pin in said array can be extended above said work surface to provide a pattern for accommodating each different harness configuration; and overlay means for covering said work surface, said over-lay means comprising a sheet having holes in select positions for allowing certain ones of said pins to extend above said work surface to form a desired pattern.

15. The universal-type harness board of claim 14, wherein said pin locking means comprises a ball detent, each pins having means defining a groove for receiving said ball detent, said ball detent holding said pin in a retracted position when said detent is disposed within said groove, and said releasing means comprises a movable sleeve, each pin being disposed within said movable sleeve, and each sleeve being depressable for displacing said ball detent from said groove, whereby each pin becomes releasable from its retracted position, each pin being biased towards the extended position by a coil spring, each sleeve being depressable manually or by a programmable robot arm and each sleeve and pin being disposed within a cylindrical housing.

16. The universal-type harness board of claim 14, wherein said board-like structure has a box-like configuration having a plurality of wells disposed therein for supporting said pins.

* * * * *

UNITED STATES PATENT AND TRADEMARK OFFICE
CERTIFICATE OF CORRECTION

PATENT NO. : 4,867,207

DATED : September 19, 1989

INVENTOR(S) : THOMAS CRAWFORD

It is certified that error appears in the above-identified patent and that said Letters Patent is hereby corrected as shown below:

Col. 1, line 22, "of" should be --of complex wiring patterns--

Col. 3, lines 61 and 62, which are claim 1, "responsive" should be --respective--

Col. 4, line 33, which is claim 10, "pin" should be --a pin-- line 36, which is also claim 10, "while" should be --which--

Col. 5, line 2, which is claim 14, "configuration" should be --configurations--

Signed and Sealed this

Eleventh Day of August, 1992

Attest:

DOUGLAS B. COMER

*Attesting Officer*          *Acting Commissioner of Patents and Trademarks*